United States Patent [19]

EerNisse et al.

[11] Patent Number: 5,012,151
[45] Date of Patent: Apr. 30, 1991

[54] THERMALLY MATCHED STRIP MOUNTED RESONATOR AND RELATED MOUNTING METHOD

[75] Inventors: Errol P. EerNisse, Salt Lake City; Roger W. Ward, Park City, both of Utah

[73] Assignee: Halliburton Company, Duncan, Okla.

[21] Appl. No.: 406,168

[22] Filed: Sep. 12, 1989

[51] Int. Cl.$^5$ ............................................. H01L 41/08
[52] U.S. Cl. ................................... 310/346; 310/348; 310/361; 310/367
[58] Field of Search ......................... 310/348, 367–369, 310/346, 360, 361

[56] References Cited

U.S. PATENT DOCUMENTS

| | | | |
|---|---|---|---|
| 3,617,780 | 11/1971 | Benjaminson et al. | 310/8.2 |
| 3,683,213 | 8/1972 | Staudte | 310/9.6 |
| 3,906,260 | 9/1975 | Oguchi | 310/367 X |
| 3,924,259 | 12/1975 | Butler | 310/367 X |
| 4,020,448 | 4/1977 | Corbett | 340/8 S |
| 4,035,674 | 7/1977 | Oguchi et al. | 310/367 X |
| 4,067,241 | 1/1978 | Corbett | 73/717 |
| 4,175,243 | 11/1979 | Corbett | 310/338 |
| 4,178,566 | 12/1979 | Kawashima | 331/156 |
| 4,216,402 | 8/1980 | Engdahl | 310/346 X |
| 4,297,610 | 10/1981 | Ito et al. | 310/370 |
| 4,349,763 | 9/1982 | Hoshi et al. | 310/370 |
| 4,429,248 | 1/1984 | Chuang | 310/370 |
| 4,437,773 | 3/1984 | Dinger et al. | 374/117 |
| 4,439,705 | 3/1984 | Corbett | 310/338 |
| 4,454,443 | 6/1984 | Lukaszek et al. | 310/367 X |
| 4,479,070 | 10/1984 | Frische et al. | 310/338 |
| 4,485,323 | 11/1984 | Corbett | 310/338 |
| 4,498,344 | 2/1985 | Dinger | 73/778 |
| 4,507,970 | 4/1985 | Dinger | 73/702 |
| 4,511,820 | 4/1985 | MacKenzie | 310/369 X |
| 4,535,638 | 8/1985 | EerNisse et al. | 73/862.59 |
| 4,547,691 | 10/1985 | Valdois et al. | 310/367 X |
| 4,550,610 | 11/1985 | EerNisse et al. | 73/702 |
| 4,562,375 | 12/1985 | Besson et al. | 310/338 |
| 4,592,663 | 6/1986 | EerNisse et al. | 374/117 |
| 4,802,370 | 2/1989 | EerNisse et al. | 73/702 |

FOREIGN PATENT DOCUMENTS

| | | | |
|---|---|---|---|
| 0056783 | 7/1982 | European Pat. Off. | 310/367 |
| 2125211 | 2/1984 | United Kingdom | 310/346 |
| 2202989 | 10/1988 | United Kingdom | 310/346 |

OTHER PUBLICATIONS

Paper entitled "Quartz Resonator Mounting and Packaging: Requirements and Techniques", by Roger W. Ward, published in 1983.

Paper entitled "Processing of a Five Resonator VHF Crystal Device", by C. W. Shanley et al., published in 1985.

Paper entitled "The Motorola Multi-Pole Monolithic Filter Project", by L. N. Dworsky et al., published in 1985.

Primary Examiner—Mark O. Budd
Attorney, Agent, or Firm—James R. Duzan; E. Harrison Gilbert, III

[57] ABSTRACT

A resonator assembly comprises a rigid support and a rigid crystal which are rigidly connected along linear segments which have one or more matched thermal characteristics. In a particular embodiment, a thermally matched resonator assembly comprises a Z-cut quartz crystal support, a quartz crystal resonator having an active region and including a crystalline structure oriented relative to X-, Y- and Z-crystallographic axes, which X- and Y-crystallographic axes define an X-Y crystallographic plane; and a rigid connector structure for rigidly connecting the resonator to the support along a segment of a line of a plane parallel to or including the X-Y crystallographic plane, which segment extends across a surface of the resonator and is spaced from the center of the active region of the resonator. A method of mounting a crystal which has the aforementioned crystalline structure to a Z-cut quartz support comprises: selecting a chord on a face of the crystal, which chord is a segment of a line of an X-Y plane intersecting the face of the crystal away from the center of an active region of the crystal; and bonding the crystal of the Z-cut quartz support along the length of the chord.

24 Claims, 2 Drawing Sheets

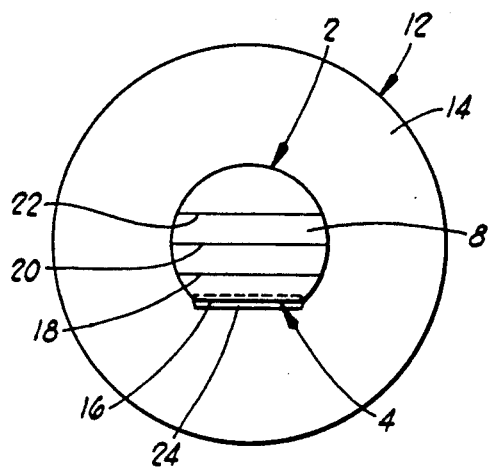
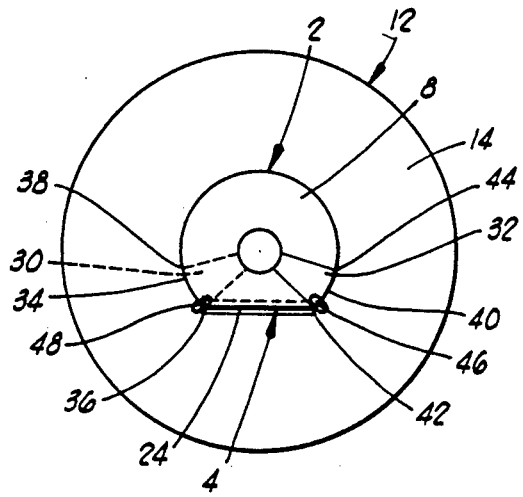
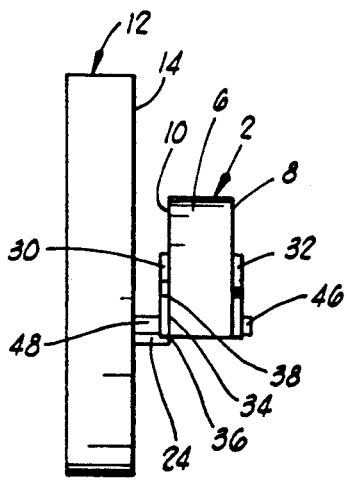
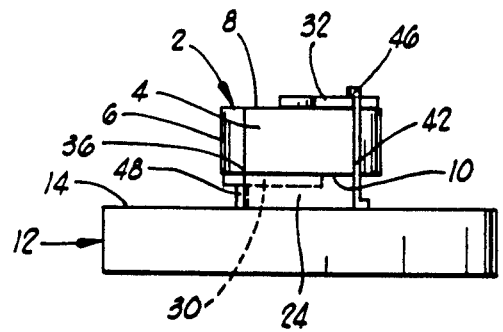

THERMALLY MATCHED STRIP MOUNTED RESONATOR AND RELATED MOUNTING METHOD

BACKGROUND OF THE INVENTION

This invention relates generally to a resonator assembly and mounting method wherein a crystal resonator is connected to a support along a linear strip where the resonator and support have one or more matched thermal characteristics. The invention more particularly relates, but is not limited, to a crystal resonator assembly and mounting method wherein a crystal resonator is mounted to a support along a segment of a line of an X-Y plane of the resonator which has a crystalline structure oriented relative to X-, Y- and Z-crystallographic axes. This particular example especially relates to a quartz crystal resonator which is to be connected to a Z-cut quartz crystal support because this resonator has the same thermal expansion coefficient and thermal expansion characteristics along such an X-Y segment as the Z-cut support, whereas these characteristics are substantially different from the Z-cut support in other directions of the resonator. Within a broader aspect of the invention, however, any chord extending across a surface of a resonator and spaced from the center of the active region of the resonator and any linear locus on the support to which the resonator is to be connected can be selected as the locations for their interconnection as long as either or both of the thermal expansion coefficient and the thermal expansion characteristics of the resonator and support along the chord and linear locus are matched.

Crystal resonators are used in sensing temperature and pressure and in providing a reference used in correcting for changes in the responses of the temperature and pressure sensors, which changes in the responses are caused by changes in temperature where the resonators are located. In at least one particular type of resonator used as a reference, the crystal which is to resonate is mounted to a crystalline support at a single point ("point" as used herein means a relatively small locus, such as a circular dot; its meaning includes but is not limited to, a geometric point of a geometric line). For example, a small dot of conductive glass frit has been used to mount a crystal resonator to a crystal support at a single point. A small dot of devitrifying glass frit has also been used adjacent the conductive glass frit to try to increase the overall strength of such single-point mount.

Although the aforementioned single-point mounted resonators are useful, the single-point mount is susceptible to being broken when the resonator is subjected to shock impulses, such as if the resonator is dropped or hit. To provide an improved mount, more than a single-point mount is needed; however, when a crystal is rigidly mounted at more than one point, it can be subjected to damaging stresses created when the crystal expands or contracts in response to temperature changes. That is, when a crystal is mounted only at one point, the remainder of the crystal is free to expand or contract. If the crystal were rigidly mounted at more than one point, on the other hand, the expansion or contraction would be resisted by the multiple mounting points at which the crystal is fixed. This could produce stresses which would in general affect the frequency-temperature response of the crystal and which could damage the crystal.

From the foregoing, there is the need for an improved mounting technique which more securely mounts a crystal resonator to its support, but which does not subject, or minimally subjects, the crystal resonator to influencing and/or damaging stresses in response to temperature changes.

SUMMARY OF THE INVENTION

The present invention overcomes the above-noted and other shortcomings of the prior art by providing a novel and improved thermally matched strip mounted resonator and related mounting method.

In the present invention, a resonator is rigidly connected to a support along a continuum, specifically a linear strip, rather than at one or more discrete points. To prevent or reduce temperature change induced stresses arising from this continuous connection, the connection is made between locations on the crystal and the support which have been selected because they have one or more matched or equivalent thermal characteristics. The specific characteristics which are matched are either the thermal expansion or the thermal expansion coefficient or both. By mounting the resonator to the support along the entire length of such a linear strip, there is obtained a stronger bond which better resists shock and vibration and yet which has one or more equivalent temperature characteristics along the mounting strip to minimize temperature change-induced stress on the crystal. Using this mounting technique, one can secure the resonator and also make electrical contacts to it without having to bond wires directly to the resonator.

In one embodiment the present invention provides a resonator assembly, comprising: a rigid support having a selected linear locus of connection and further having a thermal expansion coefficient for the locus; a rigid crystal including a surface encompassing an active region of the crystal, the surface having a selected chord thereacross spaced from the center of the active region, wherein the crystal has a thermal expansion coefficient for the selected chord equivalent to the thermal expansion coefficient for the locus; and rigid connector means for rigidly connecting the crystal to the support along the locus and chord, the rigid connector means having a thermal expansion coefficient equivalent to the thermal expansion coefficients for the locus and the chord.

In another embodiment, the resonator assembly comprises: a rigid support having a selected linear locus of connection having a thermal expansion between two selected temperatures; a rigid crystal including a surface encompassing an active region of the crystal, the surface having a selected chord thereacross spaced from the center of the active region, wherein the crystal has a thermal expansion at the selected chord equivalent to the thermal expansion at the locus; and rigid connector means for rigidly connecting the crystal to the support along the locus and chord, the rigid connector means having a thermal expansion equivalent to the thermal expansions at the locus and the chord.

In another embodiment, both the thermal expansion coefficients and the thermal expansions are matched.

In a particular embodiment, the present invention provides a thermally matched resonator assembly, comprising: a Z-cut quartz crystal support; a quartz crystal resonator having an active region and including a crystalline structure oriented relative to X-, Y- and Z-crystallographic axes, which X- and Y-crystallographic axes define an X-Y crystallographic plane; and rigid connector means for rigidly connecting the resonator to the support along a segment of a line of a plane parallel to or including the X-Y crystallographic plane, which segment extends across a surface of the resonator and which segment is spaced from the center of the active region.

The present invention also provides a method related to each of the foregoing. For example, the present invention provides a method of mounting a crystal resonator to a support, comprising: selecting a linear locus of the support where there is a known thermal expansion coefficient; selecting a chord across a surface of the resonator so that the chord is away from the center of an active region of the resonator and further so that the chord is where the resonator has a thermal expansion coefficient equivalent to the thermal expansion coefficient of the support at the linear locus; and connecting the resonator to the support along the length of the chord at the linear locus.

In a more specific embodiment, the present invention provides a method of mounting an SC-cut quartz crystal resonator to a Z-cut quartz crystal support, comprising: matching, for the resonator and the support, thermal expansion coefficients for a selected operating temperature and thermal expansions for a selected heating range between the operating temperature and a bonding temperature, including selecting a linear locus on a surface of the support and a chord on a surface of the resonator where there are equivalent thermal expansion coefficients for a selected operating temperature and equivalent thermal expansions between the operating temperature and the bonding temperature and where the chord is spaced from the center of an active region of the resonator; and rigidly bonding the resonator to the support, at the bonding temperature, along the chord and locus thereof with a continuous glass bond.

Therefore, from the foregoing, it is a general object of the present invention to provide a novel and improved thermally matched strip mounted resonator and related mounting method. Other and further objects, features and advantages of the present invention will be readily apparent to those skilled in the art when the following description of the preferred embodiments is read in conjunction with the accompanying drawings.

BRIEF DESCRIPTION OF THE DRAWINGS

FIG. 3 is a schematic plan view of a crystal resonator mounted by a linear bond to a crystal support, with several chords across a face of the resonator also being depicted.

FIG. 4 is a schematic plan view similar to FIG. 2 but also depicting two electrodes.

FIG. 5 is a schematic side elevational view of the FIG. 4 embodiment.

FIG. 6 is a schematic end elevational view of the FIG. 4 embodiment.

DETAILED DESCRIPTION OF THE PREFERRED EMBODIMENTS

Figure 1:
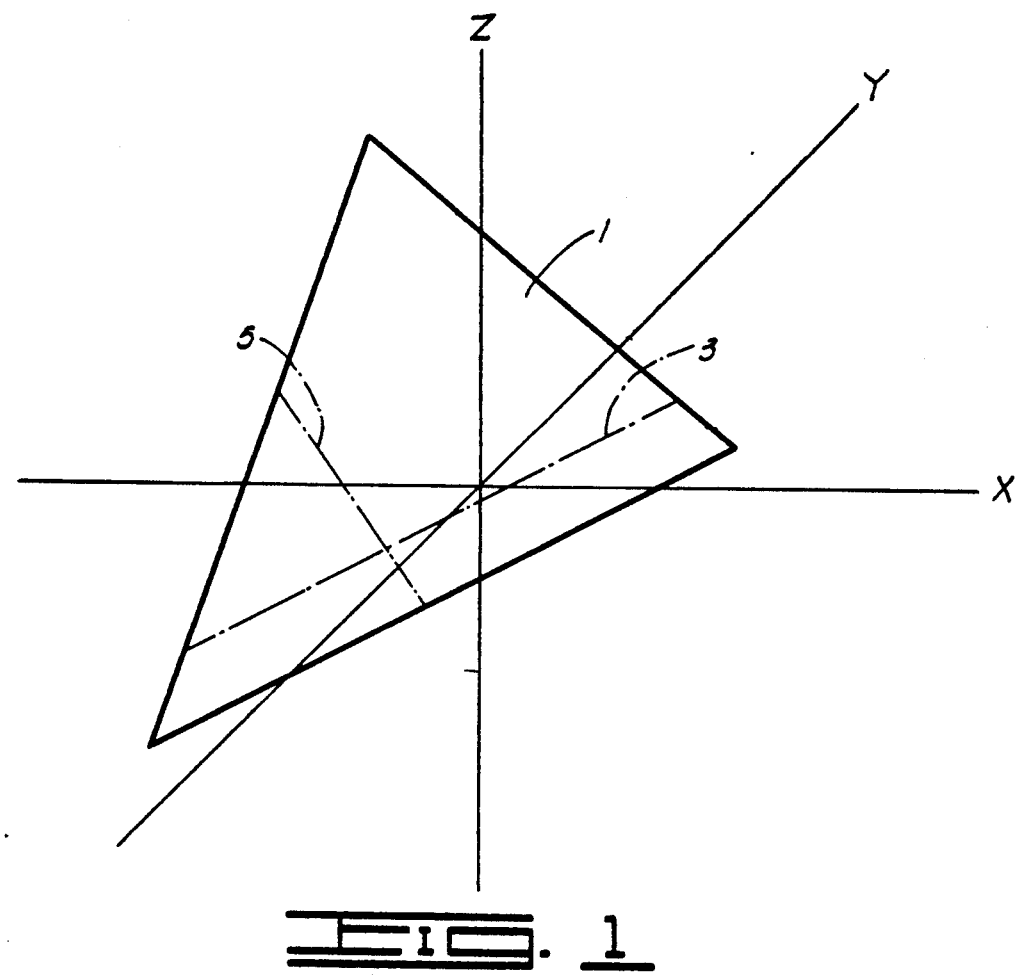
FIG. 1 is a schematic perspective view of a mounting surface of a crystal resonator shown oriented relative to X-, Y- and Z-crystallographic axes.

Before referring to the drawings, a general description of the resonator assembly of the present invention will be given.

The resonator assembly comprises three main components: a support; a crystal resonator; and a connection by which the support and resonator are joined. The connection is made at selected locations on both the support and the resonator with specific consideration to at least one of two temperature characteristics, namely the thermal expansion and the thermal expansion coefficient. The connection between the support and resonator is made where the thermal expansion coefficients of both the support and resonator are equivalent or where the thermal expansions of the support and the resonator over the same temperature range are equivalent or where both the thermal expansion coefficients are equivalent and the thermal expansions are equivalent. Preferably the corresponding characteristic or characteristics of the connection, itself, is or are equivalent to those of the support and the resonator.

As used herein, "equivalent" means that the characteristics are the same as or similar enough to each other that they are considered matched for engineering purposes. That is, they are sufficiently matched that any resulting temperature change induced stress within the support, resonator or connection is acceptable within practical engineering usage. As to thermal expansion coefficients, equivalency is typically relative to a selected temperature, such as an operating or storage temperature. As to thermal expansion, equivalency is relative to the gross deformation or movement or structural change between two temperatures, such as a bonding temperature at which the connection is made between the support and the resonator and a usage or storage temperature.

In the present invention, the support generally is a rigid substrate having a known thermal expansion coefficient for a linear locus or location where the connection with the resonator is to be made. This locus also has a known or determinable thermal expansion in response to heating or cooling between two temperatures, such as a bonding temperature and a usage or a storage temperature.

The crystal resonator of the present invention generally includes a rigid crystal blank having an active region of resonance which is known and for which the resonator is being used. In the preferred embodiment subsequently described, the center of the active region is located about a diameter of a circular crystal resonator. In the present invention, the connection of the resonator to the support is to be made at a selected location spaced from the center of the active region to avoid affecting the performance of the resonator. The location of connection more specifically is along the entire length of a selected chord which is away from the center of the active region and where it has been determined that the resonator has a thermal expansion coefficient and/or thermal expansion equivalent to those respective characteristics at the selected linear locus of the rigid support.

The connection in the present invention is generally made by a rigid connector means for rigidly connecting the crystal to the support along the aforementioned locus and chord having the matched or equivalent thermal characteristic(s). In the preferred embodiment, the rigid connector means includes a bond formed at a bonding temperature (e.g., 450° C.) which is greater than the operating or storage temperature of the resonator assembly so that the support, the crystal and the connector means contract in response to cooling from the bonding temperature to the operating or storage temperature. It is within this temperature range that the preferred embodiment of the present invention preferably has equivalent thermal expansions for each of the support at the locus, the crystal at the chord and the connector means extending between the locus and the chord making the rigid connection. As previously mentioned, the rigid connector means also preferably has a thermal expansion coefficient and a thermal expansion equivalent to those of the support at the selected locus and the resonator at the selected chord.

For some known crystals, at least, the aforementioned thermal matching is obtained along what are known as X-Y lines. To better exemplify the foregoing general explanation of the present invention, the remainder of the description of the invention will be made with reference to a crystal oriented relative to X-, Y- and Z-crystallographic axes wherein thermal matching occurs along a line of an X-Y plane.

Referring to FIG. 1, X-, Y- and Z- crystallographic axes are shown. Regardless of its outer contour or orientation, a given crystal can be oriented relative to these axes. Shown in FIG. 1 is a representation of a surface 1 of a crystal resonator which has been oriented appropriate to its particular internal structure to the X-, Y- and Z-crystallographic axes. Specific examples for the crystal surface 1 are AT-cut and SC-cut quartz resonators having centrally located active regions known in the art; however, the present invention is not limited to these specific types of crystal resonators.

For the orientation of the surface in FIG. 1, the base X-Y plane intersects the surface 1 along an X-Y line, or more specifically, an X-Y segment of an X-Y line, which segment is a chord 3 of the surface 1. For at least a quartz crystal resonator having a surface as oriented in FIG. 1, it is along this chord 3, or any chord parallel to it, that such resonator has thermal characteristics readily matched to those of a complementary Z-cut quartz crystal support to which the crystal resonator is to be connected along such a chord in a particular embodiment; provided, however, that the chord is not at the center of the active region of the resonator. The present invention is, however, broader than this exemplary X-Y segment/Z-cut quartz crystal embodiment. In general, any arbitrary chord 5 of the surface 1 can be selected as long as it is spaced from the center of the active region of the resonator and the thermal expansion coefficient and/or thermal expansion of the resonator along the chord 5 can be matched to these characteristics along a linear locus of the support where the connection between the resonator and the support can be made. For a quartz resonator and a Z-cut quartz support, an X-Y chord spaced from the center of the active region meets these criteria.

Figure 2:
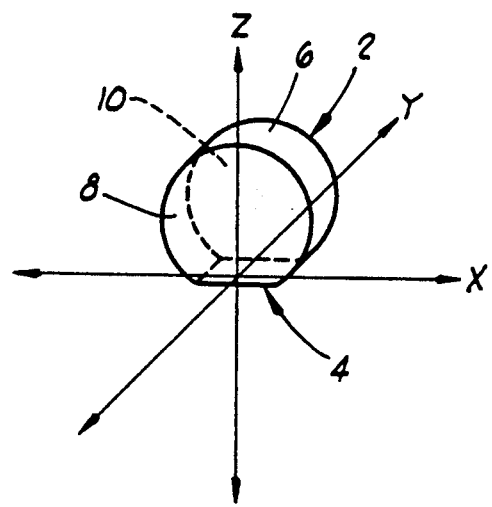
FIG. 2 is a schematic perspective view of a circular crystal resonator blank having a Z-flat oriented on an X-Y plane of an X-, Y- and Z-crystallographic axial system.

The present invention will be further described with reference to an even more specific orientation as illustrated in FIG. 2. It is to be noted that the orientation shown in FIG. 2 is likely not a practical one, at least for a resonator used as a reference; however, it is drawn as shown to simplify the drawing and the following explanation. An example of an actual practical orientation would be to rotate the resonator of FIG. 2 about the X-crystallographic axis.

Each of the resonator assemblies of the preferred embodiments of the present invention includes a crystal resonator 2, an example of which is illustrated in FIG. 2. In this embodiment, the resonator 2 is a circular quartz crystal member or blank having a crystalline structure oriented relative to X-, Y- and Z-crystallographic axes as indicated in FIG. 1. To allow one to easily identify this orientation, the edge of the resonator 2 is cut to define a flat surface 4 (referred to as a Z-flat) which lies in the X-Y plane defined by the X- and Y-axes shown in FIG. 2. Any section of the crystal resonator 2 parallel to the surface 4 would lie in its own respective X-Y plane parallel to the plane of which the surface 4 forms a part. The term "circular" as used herein includes a fully circular planar shape as well as the shape of the depicted resonator 2 wherein there is a small straight portion.

The perimeter of the crystal resonator 2 is linear along an edge of the surface 4 but is otherwise circular as defined by the substantially cylindrical side surface 6 extending circumferentially from one end of the flat surface 4 to the other end of the flat surface 4. There is such a perimeter bounding each of two flat, parallel surfaces 8, 10 which are perpendicular to the X-Y plane in which the flat surface 4 lies. Because the surfaces 4, 6 are normal to the surfaces 8, 10, the surfaces 8, 10 and their respective perimeters are aligned.

Each resonator assembly of the preferred embodiment of the present invention also includes a support 12. The support 12 of the preferred embodiments is a Z-cut quartz crystal which has a flat surface 14 which faces the surface 10 of the crystal resonator 2 when the two are connected in the relationship shown in FIG. 3. In general, the support 12 is any suitable support of a type as known in the art wherein the pertinent thermal expansion coefficient and thermal expansion are known for the location on the support where the resonator 2 is to be connected.

Drawn across the representation of the resonator 2 in FIG. 3 are four lines 16, 18, 20, 22. These represent chords across the surface 10, which is not seen in FIG. 3 but is aligned below the surface 8. The chord 20 is particularly a diameter. The chord 16 is coincident with an edge of the flat surface 4 for the flattened embodiment of the crystal resonator 2 depicted in the drawings. Each of the chords 16, 18, 20 and 22 is a segment of a respective line of a respective X-Y plane. These chords and their respective lines are parallel to the X-crystallographic axis depicted in FIG. 2; however, they would not necessarily be for a different orientation of the resonator 2 relative to the X-, Y- and Z-crystallographic axes. The chords 16, 18, 22 and any others parallel to them, except the diametric chord 20, are of significance because, at least for quartz, for example, they define locations at which the crystal resonator 2 can be connected to the support 12 in accordance with the present invention. That is, for the Z-cut quartz crystal support 12 with the surface 14 to which the resonator 2 is to be connected, any of the exemplary chords 16, 18, 22 will have suitably equivalent thermal expansion coefficient and thermal expansion characteristics. Although defining a portion of the resonator 2 which has similarly equivalent thermal characteristics, the diametric chord 20 is not suitable in the preferred embodiment because a continuous bond along a diameter, where the center of the active region is, would dampen the resonance of the crystal resonator 2. It is to be noted that such X-Y chords define relatively easy to match locations for at least quartz resonators and Z-cut quartz supports; however, these are not the only possible locations which could be used for connecting a quartz resonator in accordance with the present invention, and they are also certainly not limiting of where other types of resonators and supports could be suitably connected. In general, a connection can be made along a linear segment which is spaced from the center of the active region of the resonator and which is located where the relevant thermal characteristics of the resonator match those at the location of connection on the support.

Returning to the specific illustration of FIG. 2, to make the desired connection between the resonator 2 and the support 12, the resonator assembly of the present invention includes connector means for connecting the crystal resonator 2 to the support 12 along a segment of a line of a plane parallel to or including the plane defined by the X- and Y-crystallographic axes. More particularly, the connector means provides continuous rigid connections along the entire length of a non-diametric chord of the circular quartz resonator 2 of the illustrated preferred embodiments, which chord is on an X-Y line of the surface 10 of the resonator 2. Examples of these chords include the aforementioned chords 16, 18 and 22.

An example of a continuous, linear bond is illustrated in FIG. 3. A linear bond 24 extends along the chord 16 between the facing planar surfaces 10, 14. In a preferred embodiment, the linear bond 24 is made of a non-conductive glass bond of a type as known in the art. One particular type of bond is a non-conductive devitrifying glass frit.

The bonds of the preferred embodiments should also preferably have appropriate thermal expansion coefficients and thermal expansions compatible with the thermal expansion coefficients and thermal expansions of the particular resonator and support crystals.

Tests have shown that the described linear bonds produce a mount which requires a very sharp (e.g., less than 0.2 millisecond), high amplitude (e.g., greater than 1,000 g's) shock to break when used with a ¼- or 0.250-inch diameter, 0.010-inch thick SC- or AT-cut resonator.

In addition to the foregoing, the embodiment shown in FIGS. 4-6 is illustrated with features by which the resonator 2 can be connected into an electrical circuit. These features include electrodes 30, 32 connected to the resonator 2.

The electrode 30 is disposed on the surface 10, and the electrode 32 is disposed on the surface 8. Each electrode 30, 32 includes flat electrically conductive material across a respective sector of the respective surface on which the electrode is disposed. Each of these sectors is a radially extending sector encompassing an area from the center of the respective surface 8, 10 to a segment of the respective circular perimeter of the respective surface 8, 10. Specifically, the sector of the electrode 30 extends to a perimeter segment 34 having end points 36, 38. The electrode 32 extends across a sector terminating at its radially outward extent at an edge of the surface 8 aligned with a segment 40 of the perimeter of the surface 10. The segment 40 has end points 42, 44. As shown in FIG. 4, the end points 36, 42 are also the end points of the chord 16.

The electrodes 30, 32 are types as known in the art. To connect them into an electrical circuit, wires have typically been bonded to the metal forming the electrodes 30, 32. Bonding wires directly to the electrodes 30, 32 on the resonator 2 is not preferred because the surface 10 side of the resonator 2 to which one of the wires would be connected cannot be readily accessed once the resonator 2 has been mounted on the support 12. Bonding wires also requires one or more additional steps besides those involved in connecting the resonator 2 to the support 12.

To avoid having to bond wires directly to the electrodes 30, 32 and the resonator 2, the present invention provides electrically conductive bonds extending to locations off of the resonator 2 where wire or other electrical connections can be made. The electrical extensions from the electrodes 30, 32 can be accomplished by making the ends of the linear bond 24, at end points 36, 42, of electrically conductive material. Alternatively, the bond 24 can be electrically non-conductive but with electrically conductive point bonds added at the end points 36, 42. Still another alternative is to make the bond 24 of electrically non-conductive material and to provide two electrically conductive bonds spaced from the bond 24 near the X-Y line where the primary mounting bond is.

The last mentioned alternative is illustrated in FIG. 4 with the linear bond 24 and two electrically conductive bonds 46, 48 which are spaced from the bond 24, but which are still close enough to the X-Y line of the bond 24 to avoid significant stresses in the crystal resonator 2 being created in response to temperature changes. Actual acceptable distances for such spacing would be empirically determined for specific embodiments.

Referring to FIGS. 5 and 6, the bond 46 of the preferred embodiment is made of an electrically conductive glass frit extending from the electrode 32 on the surface 8 of the resonator 2 down to the surface 14 of the support 12 near an end of the bond 24 (i.e., near the end point 42 relative to the chord 16 and the segment 40). The bond 48 is an electrically conductive glass frit bond extending between the electrode 30 and the facing surface 14 of the support 12 near the other end of the bond 24 (i.e., near the end point 36 relative to the chord 16 and the segment 34). The end tabs of the bonds 46, 48 on the surface 14 of the support 12 provide locations to which can be bonded wires extending from an electrical circuit to which the resonator 2 is to be connected for use in a conventional manner.

In addition to providing a resonator assembly, the present invention also provides a method of mounting a crystal to a support. In a preferred embodiment, the crystal has the aforementioned crystalline structure oriented relative to X-, Y- and Z-crystallographic axes such as more generally illustrated in FIG. 1. The method comprises: selecting a chord on a face of the crystal, which chord is a segment of a line of an X-Y plane intersecting the face of the crystal away from the center of an active region of the crystal; and bonding the crystal to a Z-cut quartz support along the length of the chord. Examples of such a chord include chord 3 shown in FIG. 1 and chords 16, 18 and 22 shown in FIG. 2, but not chord 20 which is a diameter where the center of the resonator's active region is. The diameter 20 is not preferred because mounting in accordance with the present invention on the diameter 20 would dampen the resonance of the crystal resonator 2. Bonding is to be made with suitable material and in a manner as known in the art.

In a specific embodiment, the method is for mounting an SC-cut quartz crystal resonator to a Z-cut quartz crystal support. This includes: matching, for the resonator and the support, thermal expansion coefficients for a selected operating temperature and thermal expansions for a selected heating range between the operating temperature and a bonding temperature, including selecting a linear locus on a surface of the support and a chord on a surface of the resonator where there are equivalent thermal expansion coefficients for a selected operating temperature and equivalent thermal expansions between the operating temperature and the bonding temperature and where the chord is spaced from the center of an active region of the resonator; and rigidly bonding the resonator to the support, at the bonding temperature, along the chord and locus thereof with a continuous glass bond.

The present invention more generally includes the method of mounting a crystal resonator to a support to have the previously described matching of thermal expansion coefficients or thermal expansions or both.

With respect to matching thermal expansion, the method comprises: selecting a linear locus of the support where there is a known amount of thermal expansion in response to heating between two temperatures; selecting a chord across a surface of the resonator so that the chord is away from the center of an active region of the resonator and further so that the chord is where the resonator has thermal expansion equivalent to the thermal expansion of the support at the linear locus; and connecting the resonator to the support along the length of the chord at the linear locus.

With respect to matching thermal expansion coefficients, the method comprises: selecting a linear locus of the support where there is a known thermal expansion coefficient; selecting a chord across a surface of the resonator so that the chord is away from the center of an active region of the resonator and further so that the chord is where the resonator has a thermal expansion coefficient equivalent to the thermal expansion coefficient of the support at the linear locus; and connecting the resonator to the support along the length of the chord at the linear locus.

With respect to matching both, the "selecting" step of the last described method includes selecting the chord still further so that it is where the resonator also has a thermal expansion equivalent to thermal expansion of the support at the linear locus.

Further details of the methodology of the present invention are apparent from the foregoing description of the resonator assemblies of the present invention.

In accordance with the foregoing, the present invention provides a resonator assembly and a mounting method wherein a crystal resonator is more strongly connected to a support to better resist shock and vibration. In a specific embodiment, the strong connection is a linear bond placed along an X-Y line or chord of the crystal resonator to minimize temperature change-induced stresses on the resonator. More generally, the strength is obtained but such stresses are minimized by making a linear bond between thermally matched (equivalent thermal expansion coefficients and/or thermal expansion) linear locations of the resonator and support. Making the bond partially electrically conductive, or providing closely spaced additional, electrically conductive bonds, avoids the need of making wire bonds directly to electrodes on the faces of the crystal resonator.

Thus, the present invention is well adapted to carry out the objects and attain the ends and advantages mentioned above as well as those inherent therein. While preferred embodiments of the invention have been described for the purpose of this disclosure, changes in the construction and arrangement of parts and the performance of steps can be made by those skilled in the art, which changes are encompassed within the spirit of this invention as defined by the appended claims.

What is claimed is:

1. A resonator assembly, comprising:
    a rigid support having a selected linear locus of connection and further having a thermal expansion coefficient for said locus;
    a rigid crystal including a surface encompassing an active region of said crystal, said surface having a selected chord thereacross spaced from the center of said active region, wherein said crystal has a thermal expansion coefficient for said selected chord equivalent to said thermal expansion coefficient for said locus; and
    rigid connector means for rigidly connecting said crystal to said support along said locus and chord, said rigid connector means having a thermal expansion coefficient equivalent to said thermal expansion coefficients for said locus and said chord.

2. A resonator assembly as defined in claim 1, wherein:
    said thermal expansion coefficients are equivalent at an operating temperature of said resonator assembly;
    said connector means is bonded to said support and said crystal at a bonding temperature greater than said operating temperature so that said support, said crystal and said connector means contract in response to cooling from said bonding temperature to said operating temperature; and
    said support at said locus, said crystal at said chord, and said connector means have equivalent thermal expansion between said operating temperature and said bonding temperature.

3. A resonator assembly as defined in claim 2, wherein:
    said support includes quartz; and
    said crystal includes quartz.

4. A resonator assembly as defined in claim 3, wherein said connector means includes glass.

5. A resonator assembly as defined in claim 1, wherein said connector means includes a non-conductive glass bond which is between said locus of said support and said chord of said crystal and which extends along said locus and chord.

6. A resonator assembly as defined in claim 5, further comprising:
    a first electrode connected to said crystal;
    a second electrode connected to said crystal;
    a first conductive glass bond, said first conductive glass bond extending between said support and said first electrode near one end of said chord; and
    a second conductive glass bond, said second conductive glass bond extending between said support and said second electrode near the other end of said chord.

7. A resonator assembly, comprising:
    a rigid support having a selected linear locus of connection having a thermal expansion between two selected temperatures;
    a rigid crystal including a surface encompassing an active region of said crystal, said surface having a selected chord thereacross spaced from the center of said active region, wherein said crystal has a thermal expansion at said selected chord equivalent to said thermal expansion at said locus; and rigid connector means for rigidly connecting said crystal to said support along said locus and chord, said rigid connector means having a thermal expansion equivalent to said thermal expansions at said locus and said chord.

8. A resonator assembly as defined in claim 7, wherein:
said support includes quartz; and
said crystal includes quartz.

9. A resonator assembly as defined in claim 8, wherein said connector means includes glass.

10. A resonator assembly as defined in claim 7, wherein said connector means includes a non-conductive glass bond which is between said locus of said support and said chord of said crystal and which extends along said locus and chord.

11. A resonator assembly as defined in claim 10, further comprising:
a first electrode connected to said crystal;
a second electrode connected to said crystal;
a first conductive glass bond, said first conductive glass bond extending between said support and said first electrode near one end of said chord; and
a second conductive glass bond, said second conductive glass bond extending between said support and said second electrode near the other end of said chord.

12. A thermally matched resonator assembly, comprising:
a Z-cut quartz crystal support;
a quartz crystal resonator having an active region and including a crystalline structure oriented relative to X-, Y- and Z-cyrstallographic axes, said X- and Y-crystallographic axes defining an X-Y crystallographic plane; and
rigid connector means for rigidly connecting said resonator to said support only along a segment of a line of a plane parallel to or including said X-Y crystallographic plane, said segment extending across a surface of said resonator and said segment spaced from the center of said active region.

13. A resonator assembly as defined in claim 12, wherein said connector means includes a non-conductive glass bond between said support and said resonator along said segment.

14. A resonator assembly as defined in claim 13, further comprising:
a first electrode connected to said resonator;
a second electrode connected to said resonator;
a first conductive glass bond, said first conductive glass bond extending between said support and said first electrode near one end of said segment; and
a second conductive glass bond, said second conductive glass bond extending between said support and said second electrode near the other end of said segment.

15. A resonator assembly, comprising:
a support;
a circular resonator, said support including a linear locus on a surface of said support and said resonator including a non-diametric chord on a first surface of said resonator where said support and said resonator are thermally matched;
a first electrode, disposed on said first surface of said resonator;
a second electrode, disposed on a second surface of said resonator; and
connector means for connecting said resonator to said support continuously along said non-diametric chord and linear locus.

16. A resonator assembly as defined in claim 15, further comprising:
an electrically conductive bond between said first electrode and said support near an end of said non-diametric chord; and
an electrically conductive bond between said second electrode and said support near an end of said non-diametric chord.

17. A resonator assembly as defined in claim 16, wherein each of said bonds includes an electrically conductive glass frit bond.

18. A resonator assembly as defined in claim 15, wherein:
said first electrode includes flat electrically conductive material across a sector of said first surface of said resonator, said sector extending to a first segment of a circular perimeter of said first surface of said resonator, said first segment having an end point on said chord; and
said second electrode includes flat electrically conductive material across a sector of said second surface of said resonator, said sector of said second surface extending to an edge of said resonator aligned with a second segment of the circular perimeter of said first surface of said resonator, said second segment having an end point on said chord.

19. A resonator assembly as defined in claim 18, wherein said connector means includes a glass frit bond between said support and said resonator along said chord.

20. A method of mounting a crystal resonator to a support, comprising:
selecting a linear locus of the support where there is a known thermal expansion coefficient;
selecting a chord across a surface of the resonator so that the chord is away from the center of an active region of the resonator and further so that the chord is where the resonator has a thermal expansion coefficient equivalent to the thermal expansion coefficient of the support at the linear locus; and
connecting the resonator to the support along the length of the chord at the linear locus.

21. A method as defined in claim 20, wherein said selecting a chord includes selecting the chord still further so that it is where the resonator also has a thermal expansion equivalent to thermal expansion of the support at the linear locus.

22. A method of mounting a crystal resonator to a support, comprising:
selecting a linear locus of the support where there is a known amount of thermal expansion in response to heating between two temperatures;
selecting a chord across a surface of the resonator so that the chord is away from the center of an active region of the resonator and further so that the chord is where the resonator has a thermal expansion equivalent to the thermal expansion of the support at the linear locus; and
connecting the resonator to the support along the length of the chord at the linear locus.

23. A method of mounting a crystal to a Z-cut quartz support, which crystal has a crystalline structure oriented relative to X-, Y-and Z-crystallographic axes, said method comprising:

selecting a chord on a face of the crystal, which chord is a segment of a line of an X-Y plane intersecting the face of the crystal away from the center of an active region of the crystal; and bonding the crystal to the Z-cut quartz support along the length of the chord.

24. A method of mounting an SC-cut quartz crystal resonator to a Z-cut quartz crystal support, comprising:

matching, for the resonator and the support, thermal expansion coefficients for a selected operating temperature and thermal expansions for a selected heating range between the operating temperature and a bonding temperature, including selecting a linear locus on a surface of the support and a chord on a surface of the resonator where there are equivalent thermal expansion coefficients for a selected operating temperature and equivalent thermal expansions between the operating temperature and the bonding temperature and where the chord is spaced from the center of an active region of the resonator; and rigidly bonding the resonator to the support, at the bonding temperature, along the chord and locus thereof with a continuous glass bond.

* * * * *